United States Patent

Moriyasu et al.

[11] Patent Number: 6,004,657
[45] Date of Patent: Dec. 21, 1999

[54] LAMINATED ELECTRONIC PART

[75] Inventors: Akiyoshi Moriyasu, Moriyama; Yasuyuki Morishima, Tsuzuki-gun, both of Japan

[73] Assignee: Murata Manufacturing Co., Ltd., Japan

[21] Appl. No.: 08/585,171

[22] Filed: Jan. 11, 1996

[30] Foreign Application Priority Data

Jan. 13, 1995 [JP] Japan .................................. 7-004298

[51] Int. Cl.⁶ .............................. B32B 15/00; H05K 1/14
[52] U.S. Cl. .......................... 428/210; 174/255; 174/262; 257/758; 361/738; 361/763; 361/766; 428/901
[58] Field of Search .................................. 361/748, 738, 361/763, 766; 428/209, 210, 901; 257/758; 174/250, 256, 255, 262

[56] References Cited

U.S. PATENT DOCUMENTS

| | | | |
|---|---|---|---|
| 5,045,922 | 9/1991 | Kodama et al. | 357/75 |
| 5,073,814 | 12/1991 | Cole, Jr. | 257/758 |
| 5,102,720 | 4/1992 | Raj | 428/210 |
| 5,111,003 | 5/1992 | Kimbara | 428/210 |
| 5,316,831 | 5/1994 | Nakajima | 428/210 |
| 5,354,599 | 10/1994 | McClanahan | 428/210 |
| 5,384,434 | 1/1995 | Mandai et al. | 174/258 |

FOREIGN PATENT DOCUMENTS

| | | |
|---|---|---|
| 494668 | 7/1992 | European Pat. Off. . |
| 534733 | 3/1993 | European Pat. Off. . |
| 615290 | 9/1994 | European Pat. Off. . |

OTHER PUBLICATIONS

*Patent Abstracts of Japan,* vol. 007, No. 008 (E–152), Jan. 1983 & JP–A–57 166051 Oct. 13, 1982.
*Patent Abstracts of Japan,* vol. 017, No. 706 (E–1483), Dec. 22, 1993 & JP–A–05 243745, Sep. 21, 1993.
*Patent Abstracts of Japan,* vol. 014, No. 166 (E–911), Mar. 30, 1990 & JP–A–02 021610, Jan. 24, 1990.

*Primary Examiner*—Deborah Jones
*Assistant Examiner*—Cathy F. Lam
*Attorney, Agent, or Firm*—Ostrolenk, Faber, Gerb & Soffen, LLP

[57] ABSTRACT

A high degree of freedom of design and high density mounting are achieved with a laminated electronic part having a structure such that the occurrence of floating capacitance can be restrained. The laminated electronic part is formed of a first layer and a second layer which are joined to each other with a third layer sandwiched therebetween. The first and second layers may be formed of dielectrics having substantially different respective dielectric constants, and the third layer is formed of a dielectric having a dielectric constant lower than that of the first and second layers, or an insulator. Connecting conductors are provided inside the third layer. A through-conductor inside the first layer can be connected to a through-conductor inside the second, for example, layer via the connecting conductor inside the third layer.

21 Claims, 1 Drawing Sheet

LAMINATED ELECTRONIC PART

BACKGROUND OF THE INVENTION

1. Field of the Invention

The present invention relates to a laminated electronic part for use in electronic apparatuses, and more particularly to a laminated electronic part to be mounted in modules, semiconductor packages, hybrid ICs or the like for use in mobile communication equipment.

2. Description of the Related Art

A conventional laminated electronic part is disclosed in Japanese Patent Laid-Open No. 6-32382. The construction of the conventional laminated electronic part will be explained with reference to FIG. 2.

Referring to FIG. 2, reference numeral 21 denotes a laminated electronic part comprising a first layer 22 and a second layer 23 with a third layer 24 made of a thick-film glass or the like sandwiched between them.

The first layer 22 is formed by laminating a plurality of high dielectric-constant sheets (not shown) formed of ceramics having a relatively high dielectric constant, and has a shape having an obverse surface 22a, a reverse surface 22b, and sides (not shown) which are continuous with the obverse surface 22a and the reverse surface 22b. Provided inside the first layer 22 are electrodes 25 and 26 which constitute capacitor parts, each of which functions as a circuit element, and through-conductors 27 and 28 which are extended to the obverse surface 22a and the reverse surface 22b. The electrodes 25 and 26 are formed by providing conductors on the surfaces of the high dielectric-constant sheets which constitute the first layer 22. The through-conductors 27 and 28 are formed of conductors inside through-holes which go through the high dielectric-constant sheets along the thickness direction thereof and are continuous along the direction in which the high dielectric-constant sheets are laminated.

The second layer 23 is formed by laminating a plurality of low dielectric-constant sheets (not shown) formed of ceramics having a relatively low dielectric constant, and has a shape having an obverse surface 23a, a reverse surface 23b, and sides (not shown) continuous with the obverse and reverse surfaces. Provided inside the second layer 23 are electrodes 29 and 30 which constitute capacitor parts, each of which functions as a circuit element, and through-conductors 31 and 32 which are extended to the obverse surface 23a and the reverse surface 23b. The electrodes 29 and 30 are formed by providing conductors on the surfaces of the low dielectric-constant sheets which constitute the second layer 23. The through-conductors 31 and 32 are formed of conductors inside through-holes which go through the low dielectric-constant sheets along the thickness direction thereof and are continuous in the direction in which the low dielectric-constant sheets are laminated.

Further, another electronic part 33 is mounted on the surface 23a of the second layer 23, and the electronic part 33 is connected to the through-conductors 31 and 32 via terminals 34.

The first layer 22 and the second layer 23 are joined to each other with the third layer 24 sandwiched therebetween with their reverse surfaces 22b and 23b as the joining surfaces. The through-conductor 27 and the through-conductor 31 are directly connected to each other, and the through-conductor 28 and the through-conductor 32 are connected to each other via a surface conductor 35 formed by a conductor on the reverse surface 23b of the second layer 23. Another conductor is provided adjacent to the surface conductor 35, and thus surface conductor 36 is formed. The surface conductor 36 is connected to another circuit element (not shown) or the like, and thus a circuit is formed.

The laminated electronic part 21 constructed in the above-described way is mounted on a printed circuit board (not shown) with the surface 22a of the first layer 22 as the mounting surface, and is connected to the circuit wiring (not shown) on the printed circuit board.

In the laminated electronic part 21 constructed as described above, however, since the surface conductor 35 is formed on the reverse surface 23b of the second layer 23, the surface conductor 35 and the electrodes 29 face each other through a dielectric (low dielectric-constant) sheet, causing floating capacitance between them. Also, since the surface conductor 35 and the surface conductor 36 are adjacent to each other on the dielectric (low dielectric-constant) sheet, floating capacitance is caused to occur between them. Due to the influence of these floating capacitances, desired circuit characteristics cannot be obtained in the laminated electronic part 21, and there is a risk that the laminated electronic part 21 cannot be put into practical use.

The surface conductor 35 and the electrode 29, and the surface conductors 35 and 36, must be separated from each other in order to prevent an occurrence of such floating capacitance, which reduces freedom of design. For this reason, problems arise. For example, high density mounting is difficult to achieve.

SUMMARY OF THE INVENTION

Accordingly, it is an object of the present invention to provide a laminated electronic part having a construction wherein floating capacitance is reduced, the degree of freedom of design is high, and high density mounting can be achieved.

To achieve the above-described object, according to an embodiment of the present invention there is provided a laminated electronic part comprising:

a first layer, formed of a lamination of a plurality of high dielectric-constant sheets, or another high dielectric-constant structure, a circuit element provided within the first layer, and a through-conductor formed of conductors provided inside through-holes which go through the high dielectric-constant sheets or structure in the thickness direction thereof, the through-conductor being connected to the circuit element and extending outside the first layer;

a second layer, formed of a lamination of a plurality of low dielectric-constant sheets, or another low dielectric-constant structure, a circuit element provided within the second layer, and a through-conductor formed of conductors provided inside through holes which go through the low dielectric-constant sheets or structure in the thickness direction thereof, the through-conductor being connected to the circuit element and extending outside the second layer; and a third layer provided between the first and second layers, the third layer being formed of a dielectric having a dielectric constant lower than that of the high dielectric-constant sheets which constitute the first layer and the low dielectric-constant sheets which constitute the second layer, or formed of an insulator, the third layer having provided therein connecting conductor which connects the through conductor of the first layer to the through conductor of the second layer.

According to the disclosed embodiment of the present invention, the third layer sandwiched between the first and second layers is formed of a dielectric having a dielectric constant lower than that of the dielectrics from which the first and second layers are formed, or an insulator. A connecting conductor which connects the first layer to the second layer is provided inside the third layer. Therefore, the electrodes which constitute the capacitor part inside the first layer or the second layer, and the connecting conductor inside the third layer, face each other through a dielectric having a dielectric constant lower than that of the first layer and the second layer, or an insulator. Thus, the occurrence of floating capacitance between them is restrained.

Also, the connecting conductors adjacent to each other inside the third layer face each other through the same dielectric having a dielectric constant lower than that of the first layer and the second layer, or the same insulator. Thus, the occurrence of a floating capacitance between them is also restrained.

The above and further objects, aspects and novel features of the invention will become more apparent from the following detailed description when read in connection with the accompanying drawings.

DESCRIPTION OF THE PREFERRED EMBODIMENT

The construction of a laminated electronic part in accordance with an embodiment of the present invention will be described with reference to FIG. 1.

Figure 1:
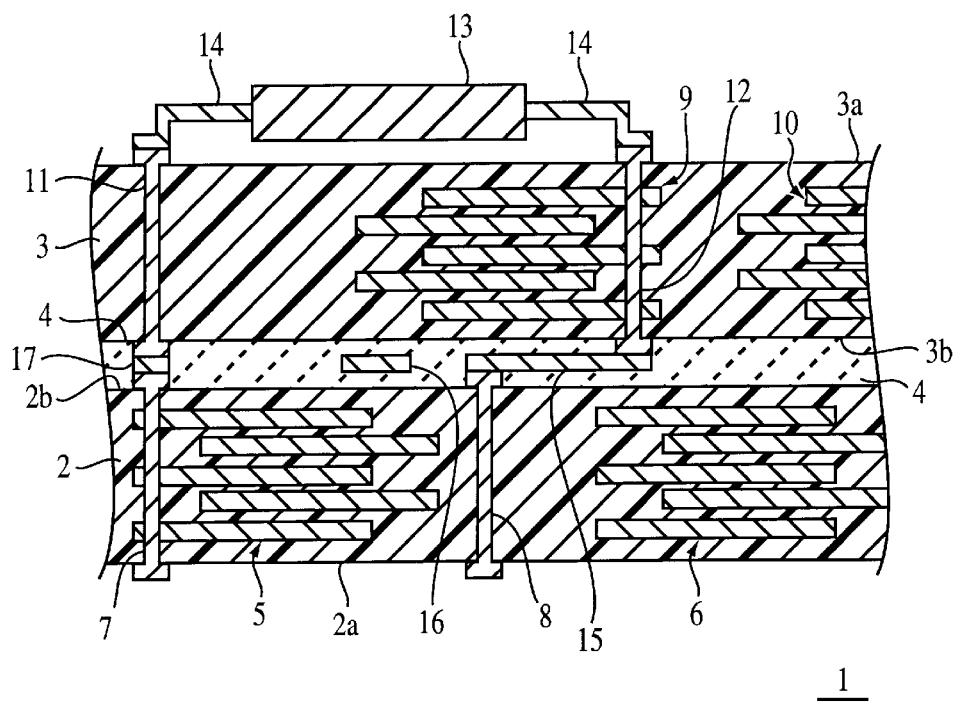
FIG. 1 is a sectional view of a laminated electronic part in accordance with one embodiment of the present invention.
Figure 2:
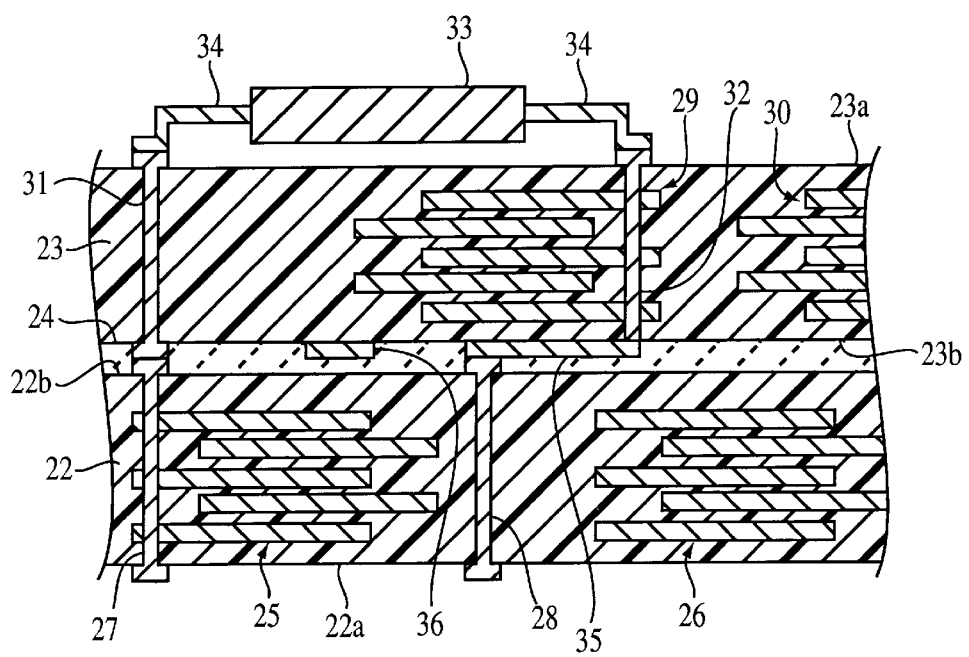
FIG. 2 is a sectional view of a conventional laminated electronic part.

Referring to FIG. 1, reference numeral 1 denotes a laminated electronic part having a first layer 2 and a second layer 3 joined with their respective reverse surfaces 2b and 3b as the joining surface with a third layer 4 sandwiched therebetween.

The first layer 2 is formed by laminating a plurality of high dielectric-constant sheets (not shown) formed of ceramics having a relatively high dielectric constant, and has a shape having an obverse surface 2a, a reverse surface 2b, and sides (not shown) which are continuous to the obverse surface 2a and the reverse surface 2b. Provided inside the first layer 2 are electrodes 5 and 6 which constitute capacitor parts, each of which functions as a circuit element, and through-conductors 7 and 8 which extend to the obverse surface 2a and the reverse surface 2b. The electrodes 5 and 6 are formed by providing conductors on the surfaces of the high dielectric-constant sheets which constitute the first layer 2. The through-conductors 7 and 8 are formed of conductors inside through-holes which go through the high dielectric-constant sheets along the thickness direction thereof and are continuous in the direction in which the high dielectric-constant sheets are laminated.

The second layer 3 is formed by laminating a plurality of low dielectric-constant sheets (not shown) formed of ceramics having a relatively low dielectric constant, and has a shape having an obverse surface 3a, a reverse surface 3b, and sides (not shown) which are continuous to the obverse surface 3a and the reverse surface 3b. Provided inside the second layer 3 are electrodes 9 and 10 which constitute capacitor parts, each of which functions as a circuit element, and through-conductors 11 and 12 which are extended to the obverse surface 3a and the reverse surface 3b. The electrodes 9 and 10 are formed by providing conductors on the surfaces of the low dielectric-constant sheets which constitute the second layer 3. The through-conductors 11 and 12 are formed of conductors inside through-holes which go through the second layer along the thickness direction thereof and are continuous in the direction in which the low dielectric-constant sheets are laminated.

In addition, another electronic part 13 is mounted on the surface of the obverse surface 3a of the second layer 3, and the electronic part 13 is connected to the through-conductors 11 and 12 via terminals 14.

The third layer 4 is formed of a dielectric having a dielectric constant lower than that of the dielectrics which constitute the first layer and the second layer, or an insulator. Connecting conductors 15, 16, and 17 are provided inside the third layer 4. When the first layer 2 and the second layer 3 are joined to each other, the through-conductor 8 is connected to the through-conductor 12 via the connecting conductor 15, and also the through-conductor 7 is connected to the through-conductor 11 via the connecting conductor 17. Further, the connecting conductor 16 is connected to another circuit element (not shown) or the like and constitutes a part of the circuit of the laminated electronic part 1.

The laminated electronic part 1 constructed as described above is mounted on the printed circuit board (not shown) with the obverse surface 2a of the first layer 2 as the mounting surface, and is connected to the circuit wiring (not shown) on the printed circuit board.

In the laminated electronic part 1, a dielectric having a low dielectric constant which constitutes the third layer 4, or an insulator, is interposed between the connecting conductor 15 and the electrodes 6 and 9, which face each other, and between the mutually adjacent connecting conductors 15 and 16. Therefore, the occurrence of floating capacitance between them is restrained. As a result, floating capacitance does not exert an influence upon the circuit characteristics, and desired circuit characteristics can be obtained.

Since the occurrence of floating capacitance is restrained, the connecting conductor 15 and the electrode 9 can be provided adjacent to each other. Also, since the connecting conductor 15 and the electrode 9 can be provided adjacent to each other, the degree of freedom of design is increased, and the laminated electronic part 1 can be mounted with a higher density.

Although this embodiment describes a case in which the layers are formed of a plurality of high and low dielectric-constant ceramic sheets, the present invention may also be applied to a case in which a high or low dielectric-constant material is molded into a sheet form.

Further, the first and second layers need not have respective high and low dielectric constants. In a suitable case, a third layer according to the present invention may be used with first and second layers having dielectric constants which are not substantially different, but rather may be substantially the same.

Also, although in this case only a capacitor part is used as an example of a circuit element provided in the first and second layers, the present invention may also be applied to a case in which a circuit element other than a capacitor part, for example, a resistor, is provided in one of the first and second layers together with the capacitor part, and further may be applied to a case in which no circuit element or elements are capacitor parts.

In addition, although this embodiment describes a case in which another electronic part is mounted on the surface of the second layer, and the surface of the first layer is the mounting surface, the present invention may also be applied to a case in which another electronic part is mounted on the surface of the first layer and the surface of the second layer is the mounting surface. Further, the present invention may be applied to a case in which no other electronic part is mounted on the laminated electronic part, and the surface of either of the first and second layers can be the mounting surface.

In addition, although this embodiment describes a case in which through-conductors provided in the first and second layers are extended to the surface of each layer, the present invention may also be applied to a case in which a through-conductor is extended to the side of each layer.

In the laminated electronic part of the disclosed embodiment of the present invention, a third layer to be sandwiched between a first and a second layer is formed of a dielectric having a dielectric constant lower than that of the dielectrics which constitute the first and second layers, or an insulator. A connecting conductor which connects the first layer and the second layer to each other is provided inside the third layer. Therefore, the electrodes which constitute a capacitor part inside the first and second layers, and the connecting conductor inside the third layer, face each other through the dielectric having a dielectric constant lower than that of the dielectrics which constitute the first and second layers, or an insulator, and thus the occurrence of floating capacitance between them can be restrained. Also, the connecting conductors adjacent to each other inside the third layer face each other through the dielectric having a dielectric constant lower than that of the dielectrics which constitute the first and second layers, or an insulator, and thus the occurrence of floating capacitance between them can also be restrained.

For the above reasons, floating capacitance does not exert any influence upon the circuit characteristics of the laminated electronic part, and desired circuit characteristics can be obtained. Further, since the occurrence of floating capacitance can be restrained, it is possible for the connecting conductors and the electrodes inside the first and second layers to be adjacent to each other, and it is also possible for the connecting conductors inside the third layer to be adjacent to each other. Thus, the degree of freedom of design is increased, and the laminated electronic parts can be mounted with a higher density.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A laminated electronic part, comprising:
   a first layer made of a ceramic material having a first dielectric constant, a first circuit element provided in said first layer, and a plurality of through-conductors provided inside a corresponding plurality of through-holes which go through said first layer, said through-conductors being connected to said first circuit element and extending to outside of said first layer;
   a second layer made of a ceramic material having a second dielectric constant, a second circuit element provided in said second layer, and a plurality of through-conductors provided inside a corresponding plurality of through-holes which go through said second layer, said through-conductors being connected to said second circuit element and extending to outside of said second layer; and
   a third layer provided between said first and second layers, said third layer being made of a material which is a dielectric or an insulator having a third dielectric constant which is lower than said first and second dielectric constants, said third layer having therein at least one connecting conductor which connects the through-conductors of said first layer to the through-conductors of said second layer;
   wherein at least one of said first and second circuit elements is a capacitor.

2. A laminated electronic part as in claim 1, wherein at least one of said first and second layers is a laminate of a plurality of dielectric sheets.

3. A laminated electronic part as in claim 2, wherein both of said first and second layers are laminates of pluralities of dielectric sheets.

4. A laminated electronic part as in claim 1, wherein at least one of said first and second layer is a molded dielectric material in the form of a sheet.

5. A laminated electronic part as in claim 4, wherein both of said first and second layers are molded dielectric material in the form of a sheet.

6. A laminated electronic part as in claim 1, wherein said first and second dielectric constants are unequal.

7. A laminated electronic part as in claim 1, wherein said first and second dielectric constants are substantially equal.

8. A laminated electronic part as in claim 1, wherein said at least one connecting conductor faces at least one of said first and second circuit elements through a portion of said third layer having said third dielectric constant.

9. A laminated electronic part as in claim 8, wherein said third layer contains a plurality of said connecting conductors which are separated from each other by a portion of said third layer having said third dielectric constant.

10. A laminated electronic part as in claim 1, wherein said third layer contains a plurality of said connecting conductors which are separated from each other by a portion of said third layer having said third dielectric constant.

11. A laminated electronic part as in claim 1, wherein both said first circuit element and second circuit element are capacitors.

12. A laminated electronic part as in claim 2, wherein said capacitor comprises a pair of conductors separated by a respective one of said plurality of dielectric sheets.

13. A laminated electronic part as in claim 1, wherein said capacitor comprises a pair of conductors separated by a corresponding portion of said one of said first and second layers.

14. A laminated electronic part, comprising:
   a first layer made of a ceramic material having a first dielectric constant, a first circuit element provided in said first layer, and a plurality of through-conductors provided inside a corresponding plurality of through-holes which go through said first layer, said through-conductors being connected to said first circuit element and extending to outside of said first layer;
   a second layer made of a ceramic material having a second dielectric constant, and a plurality of through-conductors provided inside a corresponding plurality of through-holes which go through said second layer, said through-conductors extending to outside of said second layer; and a third layer provided between said first and second layers, said third layer being made of a material which is a dielectric or an insulator having a third dielectric constant which is lower than said first and second dielectric constants, said third layer having therein at least one connecting conductor which connects the through-conductors of said first layer to the through-conductors of said second layer;

wherein said first circuit element is a capacitor.

15. A laminated electronic part as in claim 14, wherein said at least one connecting conductor faces said first circuit element through a portion of said third layer having said third dielectric constant.

16. A laminated electronic part as in claim 15, wherein said third layer contains a plurality of said connecting conductors which are separated from each other by a portion of said third layer having said third dielectric constant.

17. A laminated electronic part as in claim 14, wherein said third layer contains a plurality of said connecting conductors which are separated from each other by a portion of said third layer having said third dielectric constant.

18. A laminated electronic part as in claim 14, wherein said first and second dielectric constants are unequal.

19. A laminated electronic part as in claim 14, wherein said first and second dielectric constants are substantially equal.

20. A laminated electronic part as in claim 14, wherein said capacitor comprises a pair of conductors separated by a corresponding portion of said first layer.

21. A laminated electronic part as in claim 14, wherein said first layer is a laminate of a plurality of dielectric sheets, and wherein said capacitor comprises a pair of conductors separated by a respective one of said plurality of dielectric sheets.

* * * * *